Dec. 30, 1969 J. M. PARKYN 3,487,326

IMPEDANCE MATCHING CIRCUIT ARRANGEMENTS

Filed July 11, 1967

INVENTOR
John Michael Parkyn
BY
Baldwin Wight Diller & Brown
ATTORNEYS

United States Patent Office 3,487,326
Patented Dec. 30, 1969

3,487,326
IMPEDANCE MATCHING CIRCUIT ARRANGEMENTS

John Michael Parkyn, St. Albans, England, assignor to Marconi Instruments Limited, London, England, a British company Filed July 11, 1967, Ser. No. 652,513
Int. Cl. H03g 3/20
U.S. Cl. 330—127 3 Claims

ABSTRACT OF THE DISCLOSURE

Normal methods of providing an impedance match into a load maintain constant monitored voltage, at an output point where effectively a zero impedance is obtained, by controlling an amplifier gain by a loop including a comparator and a reference source. A series resistance equal to the required load impedance is added to provide the match. This system is inefficient since half the power is dissipated in the series resistor. The invention replaces the series resistor by a network consisting of one resistor in series with the load and two resistors in series across the load dimensioned to produce greater efficiency.

This invention relates to impedance matching circuit arrangements for use at high frequencies for providing an impedance match into a feeder or other load.

Figure 1:
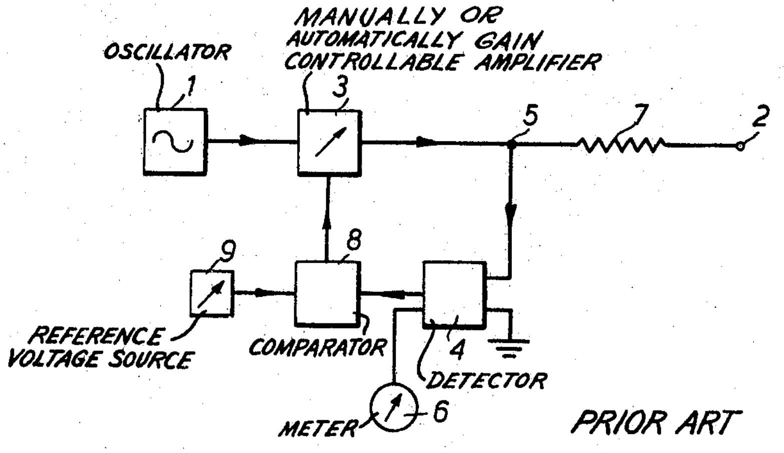
Figure 2:
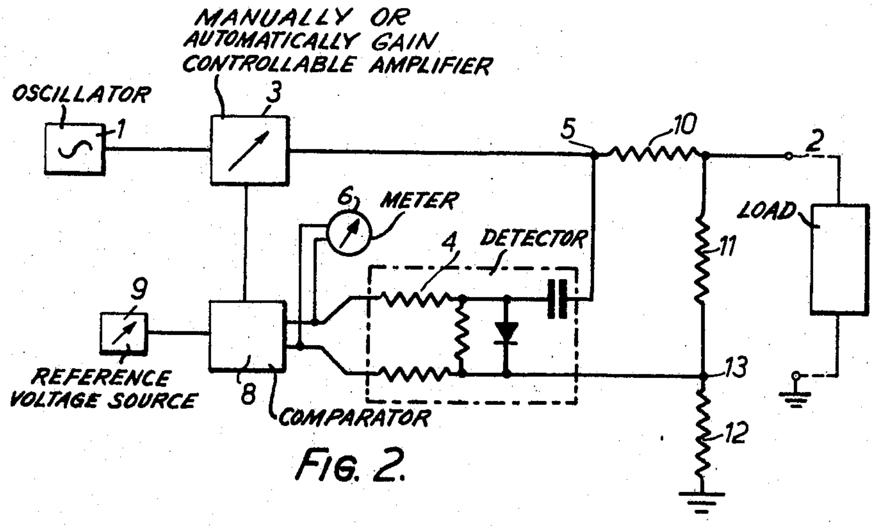

The invention is illustrated in and explained in connection with the accompanying drawings the provisional specification in which FIGURE 1 shows diagrammatically a typical known arrangement with respect to which the invention seeks to provide improvement and FIGURE 2 shows diagrammatically an embodiment of this invention.

In the typical known arrangement of FIGURE 1 a high frequency source, exemplified as an oscillator 1, feeds into a feeder or other load terminal 2 through a channel including an amplifier 3 of variable gain. A detector 4 monitors the voltage at the output point 5 of the amplifier 3. If manually controlled impedance matching is required the detected output of the detector 4 is simply fed to a meter 6 and the gain of the amplifier 3 is manually adjusted, in accordance with the meter readings, so that the said readings are maintained constant. With such adjustment an effective impedance of zero is maintained at the point 5. Between the point 5 and the output terminal 2 is inserted a resistance 7 of required value—e.g. 50 ohms—for matching with the load (not shown) connected at 2. More usual automatic adjustment of the gain of the amplifier 3 is provided. FIGURE 1 shows this. The output from the detector 4 is fed as one input to a comparator 8 the second input for which is provided from a reference voltage source 9 which may be adjustable. The output of the comparator 8 provides automatic control, in the required manner, of the gain of the amplifier 3.

The known arrangement of FIGURE 1 has the serious defect that it is inherently of low efficiency, for 50% of the power is lost in what may be termed the "padding" resistance 7. The invention seeks to reduce this defect and to enable lower loss and higher efficiency to be obtained.

According to this invention an impedance matching arrangement of the kind in which power from a high frequency source is supplied to a load through a channel including an amplifier of variable gain, comprises a series resistance inserted between the output terminal of the amplifier and the "live" load terminal, a further resistance connected across the load terminals, and means enabling the voltage between said amplifier output terminal and an intermediate tap on said further resistance to be maintained constant, said series and further resistance being so dimensioned and the tap being so positioned as to provide a desired matching impedance at the load terminals when said voltage is maintained constant.

When manual maintenance of matching impedance is required the said voltage is monitored by a detector the output from which is fed to a meter and the amplifier is of manually variable gain and, in use, its gain is varied to maintain the meter reading constant.

When automatic maintenance of matching impedance is required the said voltage is monitored by a detector the output from which is fed as one input to a comparator the second input to which is provided by a reference voltage source and the amplifier is an automatically gain controllable amplifier controlled in gain by the output from the monitoring detector.

FIGURE 2 shows an embodiment of the invention. Like references in FIGURES 1 and 2 refer to like parts.

Referring to FIGURE 2 the resistive network by means of which the required matching impedance is obtained comprises a series resistance 10 between the output terminal of the amplifier and the "live" load terminal 2 and two resistances 11, 12 together in series across the load terminals. 13 is the intermediate point between the resistances 11 and 12. The detector, which is shown in more detail than in FIGURE 1 within the chain-line block 4, monitors the voltage between the point 5 and the point 13 and, by means of the comparator 8 and reference source 9, varies the gain of amplifier 3 to maintain this voltage constant.

It will at once be apparent that a substantially higher efficiency is obtainable with the arrangement of FIGURE 2 than with that of FIGURE 1. Suppose, for example, (to quote practical figures) the resistance 10, 11 and 12 are of the respective values of 5 ohms, 45 ohms, and 455 ohms. Suppose also that the load impedance to be matched is 50 ohms and assume a 2 volt EMF between terminal 2 and earth. Then, if a virtual short circuit current of 40 ma. is taken by the load, there will be 200 mv. drop across resistance 10 and this voltage will appear at the input of the monitoring detector 4. Suppose now the load is open circuited. There will now be a 2 volt drop across the series resistances 11 and 12 i.e. across 500 ohms and 200 mv. across the 50 ohms provided by resistances 10 and 11 i.e. between the points 5 and 13. This again is the input voltage applied to the detector 4. Assume now there is a 1 volt across the external load. This will draw 20 ma. through resistance 10, but resistances 11 and 12, with 1 volt across the two of them, will draw 2 ma. Therefore the voltage drop across resistance 10 will be 110 mv. and that across resistance 11 will be $$\frac{45}{500}\times 1=90 \text{ mv.}$$

and again the total input voltage to the detector 4 is 200 mv. Thus the three stated conditions (short circuit current of 40 ma.; open circuit voltage of 2 volts; and 1 volt across a 50 ohm load) are all satisfied with a constant 200 mv. detector voltage. However the total loss in resistances 10, 11 and 12 is only 4 mw. and 20 mw. is delivered to the load, so that, with these figures (which are quite practical) the loss is only 16½% against the 50% loss in resistance 7 of FIGURE 1.

FIGURE 2 illustrates the case (the customary one in practice) in which the gain control of the amplifier 3 is automatic. Obviously, however, a meter 6 could be provided (as in FIGURE 1) for the output of the detector 4 and the gain of the amplifier 3 could be manually varied so as to maintain the meter reading constant.

I claim:

1. An impedance matching arrangement requiring manual maintenance of matching impedance of the kind in which power from a high frequency source is supplied to an output load connected across a "live" and a further load terminal through a channel including an amplifier of variable gain, said arrangement comprising a series resistance inserted between an output terminal of the amplifier and said "live" load terminal, a further resistance connected across the load terminals and having an intermediate tap thereon, and means for detecting the voltage between said amplifier output terminal and said intermediate tap on said further resistance to enable said voltage to be maintained constant, said series resistance and said further resistance providing a desired matching impedance at the load terminals when said voltage between said amplifier output terminal and said intermediate tap is maintained constant, said amplifier being of manually variable gain, and said means for detecting comprising a detector for monitoring said voltage between said amplifier output terminal and said intermediate tap, and meter means coupled with said detector for indicating the requirement for manual gain variation to maintain constant said voltage between said amplifier output terminal and said intermediate tap.

2. An impedance matching arrangement providing automatic maintenance of matching impedance of the kind in which power from a high frequency source i supplied to an output load connected across a "live" and a further load terminal through a channel including an amplifier of variable gain, said arrangement comprising a series resistance inserted between an output terminal o the amplifier and said "live" load terminal, a further re sistance connected across the load terminals and having an intermediate tap thereon, and means for detecting the voltage between said amplifier output terminal and said intermediate tap on said further resistance to enable said voltage to be maintained constant, said series resistance and said further resistance defining means for providing a desired matching impedance at the load terminals when said voltage between said amplifier output terminal and said intermediate tap is maintained constant, said amplifier being an automatically gain controllable amplifier, and said means for detecting comprising a detector for monitoring said voltage between said amplifier and said intermediate tap, a reference voltage source and comparator means having one input coupled to said reference voltage source and a further input coupled to said detector, said comparator means having an output connected with said automatically gain controllable amplifier for controlling the gain thereof to maintain constant said voltage between said amplifier output terminal and said intermediate tap.

3. An impedance matching arrangement comprising a signal source, an amplifier coupled to said signal source for driving an output load having a "live" and a further load terminal from the output of said amplifier, resistive means coupled intermediate the output of said amplifier and said load for providing an impedance therebetween and for providing a voltage indicative of a predetermined effective matching impedance for said output load, said output load being coupled to said amplifier only through said resistive means, said resistive means comprising a first resistance connected in series between an output terminal of said amplifier and said output load "live" terminal and a further resistance coupled in parallel across said output load, said further resistance having a tap intermediate the ends thereof dividing said further resistance into two series resistances, the voltage across said first resistance and one of said two series resistances providing said voltage indicative of a predetermined effective matching impedance, said combined voltage being constant at said predetermned effective matching impedance, and means connected to said tap and said first resistance for detecting variations in said combined voltage requiring adjustment of the gain of said amplifier to maintain matching of said amplifier and said load, said amplifier comprising an automatically gain controllable amplifier, the arrangement further comprising means connected between said amplifier and said means for detecting variations in said combined voltage for applying a gain control signal to said amplifier in response only to the detected combined voltage across said first resistance and said one of said two series resistances.

References Cited

UNITED STATES PATENTS

| | | | |
|---|---|---|---|
| 1,993,758 | 3/1935 | Stillwell | 330—109 X |
| 2,170,046 | 8/1939 | Anderson et al. | 330—100 X |
| 2,298,192 | 10/1942 | Bollman | 330—146 X |
| 2,324,408 | 7/1943 | Marble | 330—146 X |

ROY LAKE, Primary Examiner

JAMES B. MULLINS, Assistant Examiner

U.S. Cl. X.R.

330—146